United States Patent
Berger et al.

(10) Patent No.: US 7,255,153 B2
(45) Date of Patent: Aug. 14, 2007

(54) HIGH PERFORMANCE INTEGRATED MLC COOLING DEVICE FOR HIGH POWER DENSITY ICS AND METHOD FOR MANUFACTURING

(75) Inventors: Daniel G. Berger, New Paltz, NY (US); Raschid J. Bezama, Mahopac, NY (US); Lester W. Herron, New Paltz, NY (US); Bruno Michel, Adliswil (CH); Govindarajan Natarajan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,758

(22) Filed: May 25, 2005

(65) Prior Publication Data
US 2006/0266497 A1 Nov. 30, 2006

(51) Int. Cl.
*H05K 7/20* (2006.01)

(52) U.S. Cl. ............... 165/80.4; 165/908; 361/699; 257/714

(58) Field of Classification Search ........... 165/80.4, 165/170, 908; 257/714; 361/699
See application file for complete search history.

(56) References Cited
U.S. PATENT DOCUMENTS

| | | | | |
|---|---|---|---|---|
| 3,909,118 A | * | 9/1975 | Schmidt | 165/908 |
| 4,302,793 A | * | 11/1981 | Rohner | 361/699 |
| 4,740,866 A | * | 4/1988 | Kajiwara et al. | 165/80.4 |
| 4,758,926 A | * | 7/1988 | Herrell et al. | 361/699 |
| 5,265,670 A | * | 11/1993 | Zingher | 165/80.4 |
| 5,269,372 A | * | 12/1993 | Chu et al. | 165/80.4 |
| 5,309,319 A | * | 5/1994 | Messina | 361/699 |
| 5,388,635 A | | 2/1995 | Gruber et al. | |
| 5,731,954 A | * | 3/1998 | Cheon | 361/699 |
| 6,234,240 B1 | * | 5/2001 | Cheon | 165/80.4 |
| 6,459,581 B1 | | 10/2002 | Newton et al. | |
| 6,606,251 B1 | | 8/2003 | Kenny, Jr. et al. | |
| 6,650,542 B1 | | 11/2003 | Chrysler et al. | |
| 6,678,168 B2 | | 1/2004 | Kenny, Jr. et al. | |
| 6,688,110 B2 | * | 2/2004 | Dailey et al. | 165/908 |

* cited by examiner

*Primary Examiner*—Leonard R. Leo
(74) *Attorney, Agent, or Firm*—DeLio & Peterson, LLC; Kelly M. Nowak; Ira D. Blecker

(57) ABSTRACT

A manifold apparatus, system and method for thermally controlling a substrate whereby a manifold body having a microjet array and a drain array traversing there-through in a direction orthogonal to a substrate surface and parallel to each other is attached to the substrate surface for heating or cooling thereof. A cavity of the manifold body resides over the substrate surface such that liquid is emitted from the liquid microjets into the cavity for contact with the substrate surface, while the drains orthogonally remove spent liquid from the cavity. The manifold body is designed and configured into a plurality of cooling cells, whereby each cooling cell has a liquid microjet surrounded by at least three drains for preventing interactions between adjacent liquid microjets within adjacent cooling cells. Gas microjets may also traverse through the manifold body to form an atomized liquid spray for contact with the substrate surface.

17 Claims, 11 Drawing Sheets

HIGH PERFORMANCE INTEGRATED MLC COOLING DEVICE FOR HIGH POWER DENSITY ICS AND METHOD FOR MANUFACTURING

BACKGROUND OF THE INVENTION

1. Field of the Invention

The present invention relates to electronic devices, and in particular, to a cooling structure for transferring heat out of electronic components and methods of manufacturing such cooling structure.

2. Description of Related Art

Modern electronic devices often employ chips having increased power densities due to the continually increasing transistor densities, chip operating frequencies and current leakages. However, current cooling structures and capabilities are generally not scalable to meet the demands of these increased power densities.

Conventional thermal technologies for cooling electronic devices include the use of heat spreaders, heat sinks, and associated thermal interfaces. However, these conventional technologies are insufficient for cooling electronic devices when the cooling fluid thermal budget is small. Conventional cooling technologies are also insufficient for cooling electronic devices having high average power flux, and/or high local power flux (hot spots), such as those having average power flux above 200 W/cm$^2$ and even very high average power flux exceeding 400 W/cm$^2$. For instance, in electronic devices having such high average power flux, a high power hot spot may dissipate 300 to 500 W/cm$^2$, while a very high power hot spot may dissipate more than 500 W/cm$^2$. Under such processing conditions, if the cooling method is primarily based on a heat conduction mechanism, the power flux will be sufficiently large such that it generates significant thermal gradients along the cooling axis.

In these high power flux situations that generate significant thermal gradients along the cooling axis, acceptable cooling techniques typically require the use of single phase fast forced convection and/or two phase evaporation based devices with a circulating fluid. However, higher cooling solutions often require higher fluid flow rates which result in an increase in pressure drop on the cooler. Yet, known cooling solutions based on a circulating fluid have a maximum operating pressure for preventing fluid leakage and/or mechanical damage to the system. Thus, in both cases, the extendibility of known cooling solutions is deleteriously limited by the pressure drop required to operate the cooler in high power flux situations.

Figure 1:
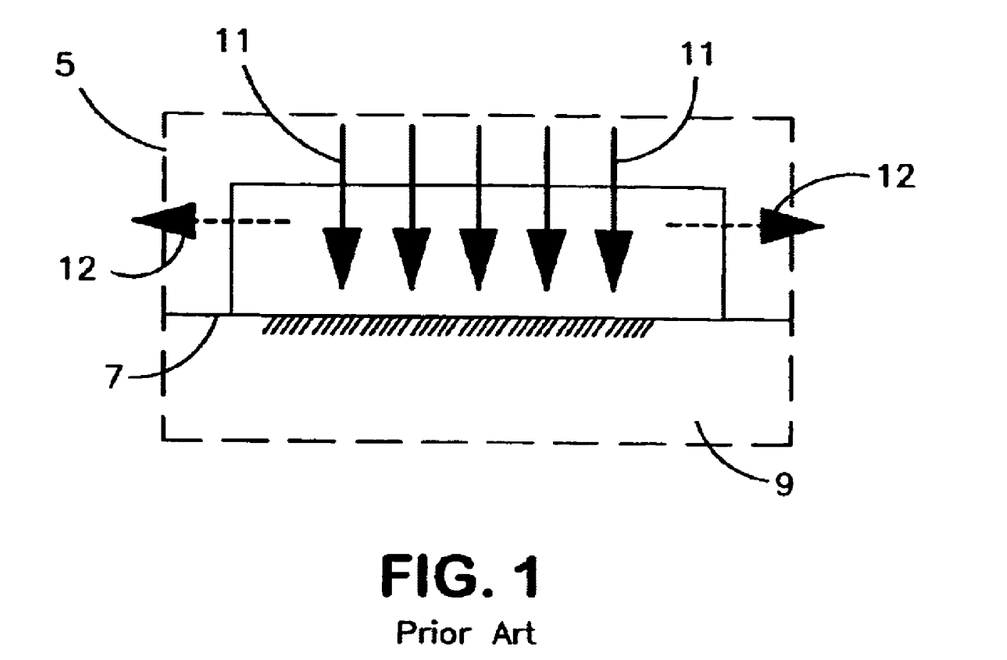
FIG. 1 is a prior art illustration of a side view of a conventional cooling manifold having lateral drains for removing spent cooling fluid.

For instance, FIG. 1 illustrates a prior art heating/cooling device 5 that includes a cluster or array of fluid jets 11 impinging orthogonally on a surface 7 of an electronic component 9, such as a semiconductor chip, and a lateral drain 12 for removing the spent fluid. The fluid jet array 11 provides a high heat transfer rate when used to heat or cool the surface 7, as compared to conventional convection heating and/or cooling processes.

In this scenario, the high kinetic energy of the array of fluid jets 11 provides fresh jet fluid in close proximity to surface 7 in the region directly below the array of jets, generally at the center of the electronic component, thereby enabling high heating or cooling rates at such regions. However, this high heating/cooling transfer rate decreases rapidly in areas of surface 7 not residing directly below the surface area impinged by the jet fluid. This undesirably results in uneven cooling across the surface of the electronic component, particularly from the center to the edge of the electronic component.

These conventional heating/cooling devices that employ a cluster of fluid jets in combination with the lateral drain 12 are also insufficient for cooling high power flux situations due to the lack of proper spent fluid drainage. These lateral drains remove the spent fluid in a radial flow pattern away from a fluid jet at the center of the surface. In so doing, the drain velocity increases approximately linearly with the number of fluid jet rows encountered from the central jet row(s) to the fluid drain outlet located at the periphery of such jet array, thereby reaching a maximum velocity at such periphery.

These types of conventional fluid jet arrays are also impractical for cooling high power flux situations due to their structural designs. Conventional single-phase jet array structural designs limit the drain velocity such that it does not exceed 50% of the fluid jet array velocity. Drain velocities above 50% of the fluid jet array velocity undesirably force the fluid jets to move away from the desired orthogonal orientation, thereby reducing the heat transfer rate by more than 20% relative to the heat transfer rate of a fully orthogonally oriented jet. This problem increases significantly in two-phase coolers, where the gas phase volumetric flow can be up to three orders of magnitude larger than the liquid flow.

The thermal performance of prior art fluid jet arrays has been studied extensively, both theoretically and experimentally, particularly those having high jet Reynolds numbers, e.g., jet Reynolds numbers over 2000. In so doing, it has been found that high jet Reynolds numbers, along with optimization of the fluid jet array, can maximize the thermal performance of a given jet cluster geometry. However, such high jet Reynolds numbers can also undesirably result in a large pressure drop on the cooling device, thereby rendering it useless for its intended purpose.

Further, in conventional fluid jet arrays of current cooling/heating devices, an evaluation of the thermal performance thereof. Indicates that the heat transfer coefficient increases with decreasing jet diameter. However, existing optimization guidelines for current fluid jet arrays requires well-defined jet pitch and gap height (i.e., spacing between the jet array and the target surface) to maximize heat transfer rates. This, often requires fluid jet diameters as small as feasible, with a maximum jet velocity limited by keeping the cooler total pressure drop below a given practical limit, for example 10 psig, and operating as close to the surface as required by the geometric optimization algorithm.

Unfortunately, these parameters critically limit conventional fluid jets to have fewer than approximately 200 individual jets if a relatively uniform and high heat transfer rate is desired. For example, to maximize the cooling capability of a high power silicon chip with a hot surface area of 400 mm$^2$ using a conventional cooling device, the cooling device should have 196 fluid jets with a minimum jet pitch of about 1400 microns, jet diameter of 400 microns or more, and minimum gap height of 1600 microns. Any deviations to smaller dimensions will undesirably result in lower thermal performance, thereby resulting in insufficient cooling of the chip. Further, using these conventional devices, cooling is undesirably varied across the surface of the chip. For instance, if the coolant is water with an inlet temperature of 22° C. and average jet velocity of 2 m/s, and the chip has a thickness of about 0.75 mm with a maximum junction temperature at 85° C., then the maximum average heat flux capability of the cooling/heating device at the chip center is approximately 170 W/cm$^2$, while this capability will get reduced to less than 135 W/cm$^2$ at the chip edge.

Accordingly, a need exists for improved methods of maximizing the heat transfer rate of fluid jet arrays for cooling, or heating, components having high power flux, which generates significant thermal gradients along the targeted surface.

SUMMARY OF THE INVENTION

Bearing in mind the problems and deficiencies of the prior art, it is therefore an object of the present invention to provide methods of maximizing the heat transfer rate of fluid jet arrays of thermal cooling/heating manifolds.

It is another object of the present invention to provide methods of making improved cooling/heating manifolds for use in high power flux situations.

Yet another object of the present invention is to provide a heating/cooling fluid jet manifold with a distributed spent fluid return network.

Another object of the present invention is to provide cooling/heating manifolds, and methods of making the same, having sufficiently high cooling flux capabilities while enabling low pressure drops.

Still another object of the present invention is to provide cooling/heating manifolds, and methods of making the same, having uniform heat transfer rate capabilities that are independent of the shape and size of the cooling/heating surface of the heat generating body to be cooled.

Yet another object of the present invention is to provide cooling/heating manifolds, and methods of making the same, for cooling surfaces on a heat generating component having prescribed non-uniform heat transfer rates, including local hot spots.

Another object of the present invention is to provide cooling/heating manifolds that are capable of cooling at a rate above about 100 W/cm$^2$ with total internal liquid pressure drops below 10 psig.

It is another object of the present invention to provide cooling/heating manifolds having fluid jet array clusters with over 200 jets in the array without drain velocity driven performance degradation.

Still another object of the present invention is to provide cooling/heating manifolds having fluid jet diameters less than about 400 microns operating at a distance to the surface below about 1 mm, and with jet-to-jet pitch less than about 500 microns.

Yet another object of the present invention is to provide a planar cooling structure with at least a cold and a hot intertwined multilayer fluid networks separated by an insulating wall.

Still other objects and advantages of the invention will in part be obvious and will in part be apparent from the specification.

The present invention is directed to, in a first aspect, a liquid impingement manifold apparatus for thermal control of a substrate that has a manifold body for attachment to a substrate surface. The manifold body includes a microjet array traversing there-through, in a direction orthogonal to the substrate surface, and a drain array traversing through the manifold body adjacent to and parallel to the microjet array. A cavity of the manifold body resides over the substrate surface, whereby the microjet array emits a liquid into the cavity for contact with the substrate surface while the drain array removes spent liquid from the cavity in the orthogonal direction.

The manifold body may be glass-ceramic material, silicon, AlN, SIC, Cu, Ni, alloys thereof, with and without polymers and plastics, or even combinations thereof, preferably, the manifold body and the substrate comprise materials having compatible thermal coefficients of expansion. In the apparatus, the microjet array preferably resides within an inlet manifold while the drain array resides within a drain manifold that is interconnected with the inlet manifold. The manifold body has two predetermined dimensionless units, the first being a dimensionless minimum microjet pitch that ranges from, preferably, about 3 to about 4 dimensionless units, and the second being a dimensionless gap height that ranges from, preferably, about 2 to about 3 dimensionless units. The dimensionless units are in relation to microjet hydraulic diameter.

The apparatus may further include a plurality of cooling cells within the manifold body, whereby each cooling cell has a microjet, substantially at a center thereof, that is surrounded by at least three drains. These cooling cells may be uniformly shaped, non-uniformly shaped, triangular shaped cooling cells with a drain located at each vertex thereof (i.e., have three drains) or they may be square shaped cooling cells with a drain located at each vertex thereof (i.e., have four drains).

At least one lateral drain may also be included within the manifold body. Optionally, a second manifold body may be attached to the first manifold body. Preferably, the first and second manifold bodies have compatible thermal coefficients of expansion. In this aspect, the second manifold has a second microjet array and second drain array that are, respectively, in alignment with the microjet array and drain array of the first manifold body. However, the microjet and drain arrays of the second manifold have different dimensions (e.g., either smaller or larger) than the dimensions of the microjet and drain arrays of the first manifold body.

In another aspect, the invention is directed to a liquid impingement manifold apparatus for thermal control of a substrate that has a manifold body for attachment to a substrate surface. The manifold body includes a liquid microjet and a gas microjet both traversing there-through and opening into a first cavity of the manifold body. The manifold body also has a second cavity in communication with the first cavity. This second cavity is larger in size compared to a size of the first cavity. A drain traverses through the manifold body, parallel to the liquid microjet, and has an open end within the second cavity. In the manifold apparatus, the liquid microjet emits a liquid and the gas microjet emits a gas into the first cavity to form an atomized liquid spray, which is forced into the second cavity. Once in the second cavity, this atomized liquid contacts the substrate surface and evaporates for thermal control thereof, while the drain removes spent vaporized liquid molecules from the second cavity in a direction orthogonal to the substrate surface.

The above liquid impingement manifold apparatus preferably includes pluralities of these gas microjets, liquid microjets, first cavities and drains. In this aspect, the plurality of first cavities open into the second cavity, whereby each first cavity has at least one liquid microjet surrounded by at least one gas microjet, and at least three drains surrounding each liquid microjet. The drains have open ends within the second cavity. Preferably a plurality of cooling cells with at least three vertices each are provided within the manifold body.

The liquid and gas microjets may reside within an inlet manifold of the apparatus, while the drains may reside within a drain manifold. These inlet and drain manifolds are intertwined with each other. The manifold apparatus may also include at least one lateral drain within the manifold body, a second manifold body attached to the first manifold body discussed above, or combinations thereof (i.e., a lateral drain in combination with a second manifold body.) The second manifold body has microjets and drains with different dimensions (i.e., smaller diameters, larger diameters, or combinations thereof) in locations corresponding to the microjets and drains of the first manifold body.

In yet another aspect, the invention is directed to a system for thermal transfer. The system includes a substrate having a temperature in need of modulating and a manifold body attached to a surface of such substrate. The manifold body includes a microjet array and drain array both traversing through the manifold body in a direction orthogonal to the substrate surface and parallel to each other. The manifold body also includes a cavity over the substrate surface, whereby the microjet array emits a liquid into the cavity for contact with the substrate surface, for thermal control thereof, while the drain array removes spent thermal liquid from the cavity in the direction orthogonal to the substrate surface.

In still another aspect, the invention is directed to a method for thermally controlling a substrate temperature. The method includes providing a manifold body having a microjet array and a drain array both traversing through the manifold body in a direction parallel to each other and orthogonal to a surface of a substrate. Each microjet is surrounded by at least three drains. The manifold body is attached to the substrate surface whereupon a cavity is formed there between. A liquid is emitted from the microjet array into the cavity, and then this liquid contacts the substrate surface for controlling a temperature thereof. The spent thermal liquid is then removed from the cavity in a direction orthogonal to the substrate surface via the drain array. Since each microjet is surrounded by at least three drains, interactions between adjacent microjets are substantially avoided.

In this method, the manifold body may further include a plurality of cooling cells, whereby these cooling cells are triangular in shape, square in shape, uniformly shaped, non-uniformly shaped or even combinations thereof. The manifold may deliver cooling liquid to the substrate surface for cooling such surface, or it may deliver heated liquid to the substrate surface for heating such surface.

The manifold may include at least one lateral drain for removing undesirable matter from the cavity, or it may be attached to a second manifold body having smaller, larger, or combinations thereof microjet arrays and/or drains. An essential feature of the design and structure of the present manifold is that it is capable of controlling temperatures at a rate above about 100 W/cm$^2$ while maintaining a total internal liquid pressure drop below about 10 psig.

The cavity of the manifold may be a combination of a plurality of smaller first cavities that each open into and are in communication with a larger second cavity. In this aspect, the liquid microjet array and a gas microjet array may have open ends within these smaller first cavities such that when they emit a liquid and a gas, respectively, an atomized liquid spray is formed within the first cavities. The atomized liquid is forced into the second cavity, via the gas microjet array, for contact with the substrate surface. The drain array has openings within the second cavity such that spent vaporized liquid is removed from the second cavity via such drains. These liquid microjet and gas microjet arrays and the drain array may be designed, configured and constructed into a plurality of cooling cells across the manifold body.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 2A-10 of the drawings in which like numerals refer to like features of the invention.

Figure 2A:
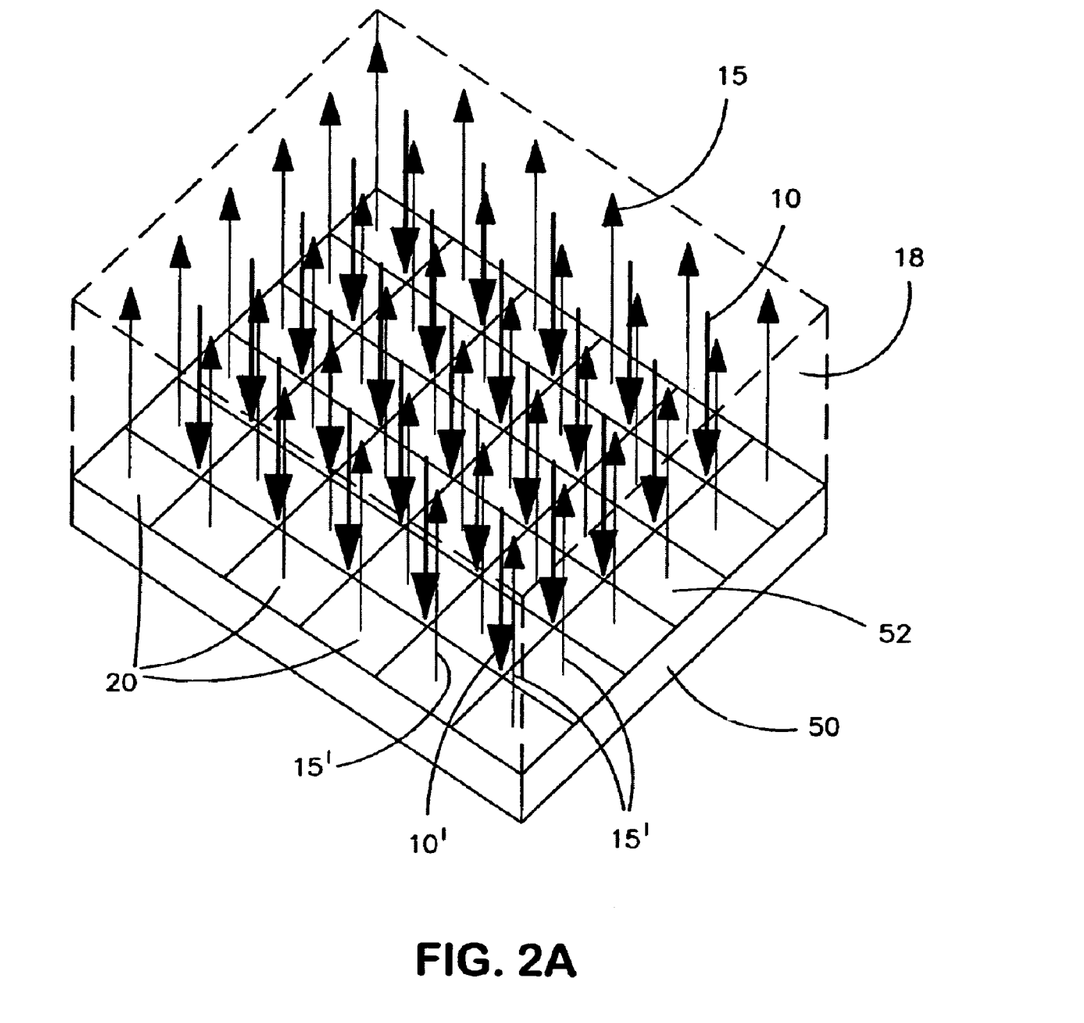
FIG. 2A is a perspective view of the invention showing a fluid microjet array orthogonal to a target surface in combination with a via drain distributed network also orthogonal to the target surface within a cooling cell configuration of a liquid impingement manifold.
Figure 2B:
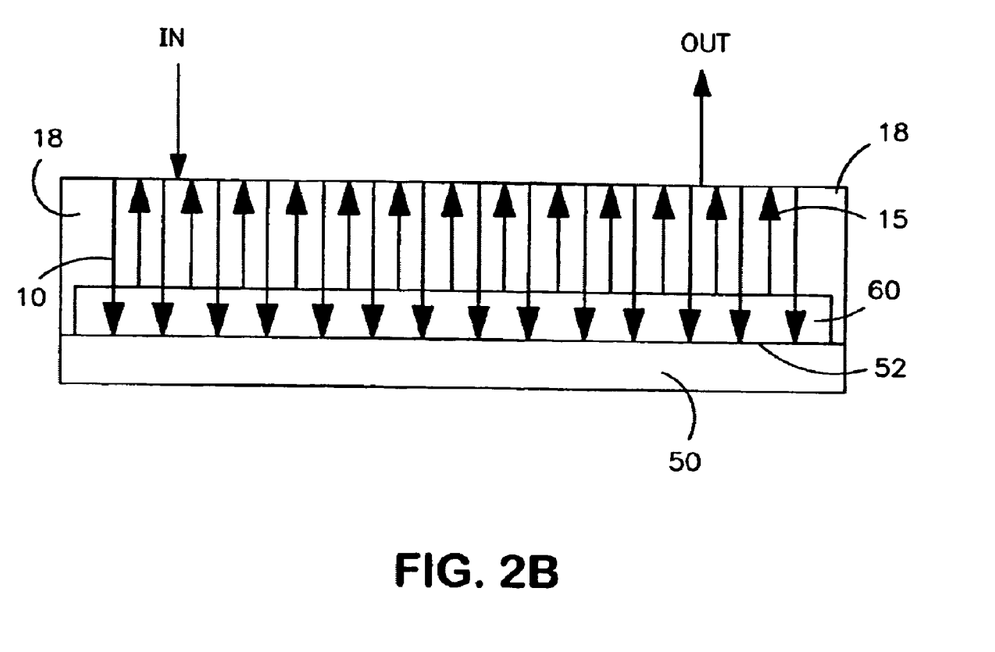
FIG. 2B is a side view of the invention showing a fluid microjet array and via drain distributed network within a liquid impingement manifold apparatus of the invention.

Referring to FIGS. 2A-B a preferred embodiment of the invention is shown whereby a surface 52 of a heat generating component 50, such as a semiconductor chip, is cooled using a liquid impingement manifold 18 of the invention. It should be appreciated that the manifold 18 is a thermal manifold, and as such, it may be used for cooling targeted surfaces or it may be used to heat such surfaces.

In accordance with the invention, the manifold 18 is composed of a fluid microjet array depicted by downward arrows 10 (hereinafter referred to as "fluid microjet array 10") in combination with a via drain network depicted by upward arrows 15 (hereinafter referred to as "via drain network 15"). The fluid microjet array 10 traverses through a thickness of the manifold orthogonally to the target surface 52. This fluid microjet array 10 allows cooling fluid to be provided into each fluid microjet from a top surface of the manifold toward the target surface 52 such that the cooling fluid has an inflow velocity orthogonally toward the target surface 52. The cooling fluid exits the microjet array 10 at a bottom surface of the manifold and contacts the target surface 52 to cool such surface at a predetermined cooling rate distribution.

An essential feature of the manifold 18 is the via drain network 15 for removing spent cooling fluid. This via drain network 15 traverses through a thickness of the manifold in a direction orthogonal to the target surface 52 and parallel to the fluid microjet array 10. The via drain network 15 enables removal of the spent cooling fluid from a cavity or fluid gap area 60 directly over the target surface 52 at an outflow velocity also orthogonally away from the target surface 52. In so doing, the via drain network 15 intakes the spent fluid from the bottom surface of the manifold and removes spent fluid at the manifold top surface.

As shown in FIG. 2A, another critical feature of invention is that manifold 18 is designed and geometrically formed with a plurality of sub-millimeter cooling cells 20 (as delineated by the lines shown on the target surface 52 in FIG. 2A). In forming the cooling cells 20 of manifold 18, a cooling cell configuration is predetermined. These cooling cells may have a variety of finite geometrical shapes including, but not limited to, squares, triangles, and the like, and even combinations thereof. (See, FIGS. 2A, 3 and 4). Preferably, the cell shape has at least three (3) vertexes for positioning of the drain streams.

Figure 3:
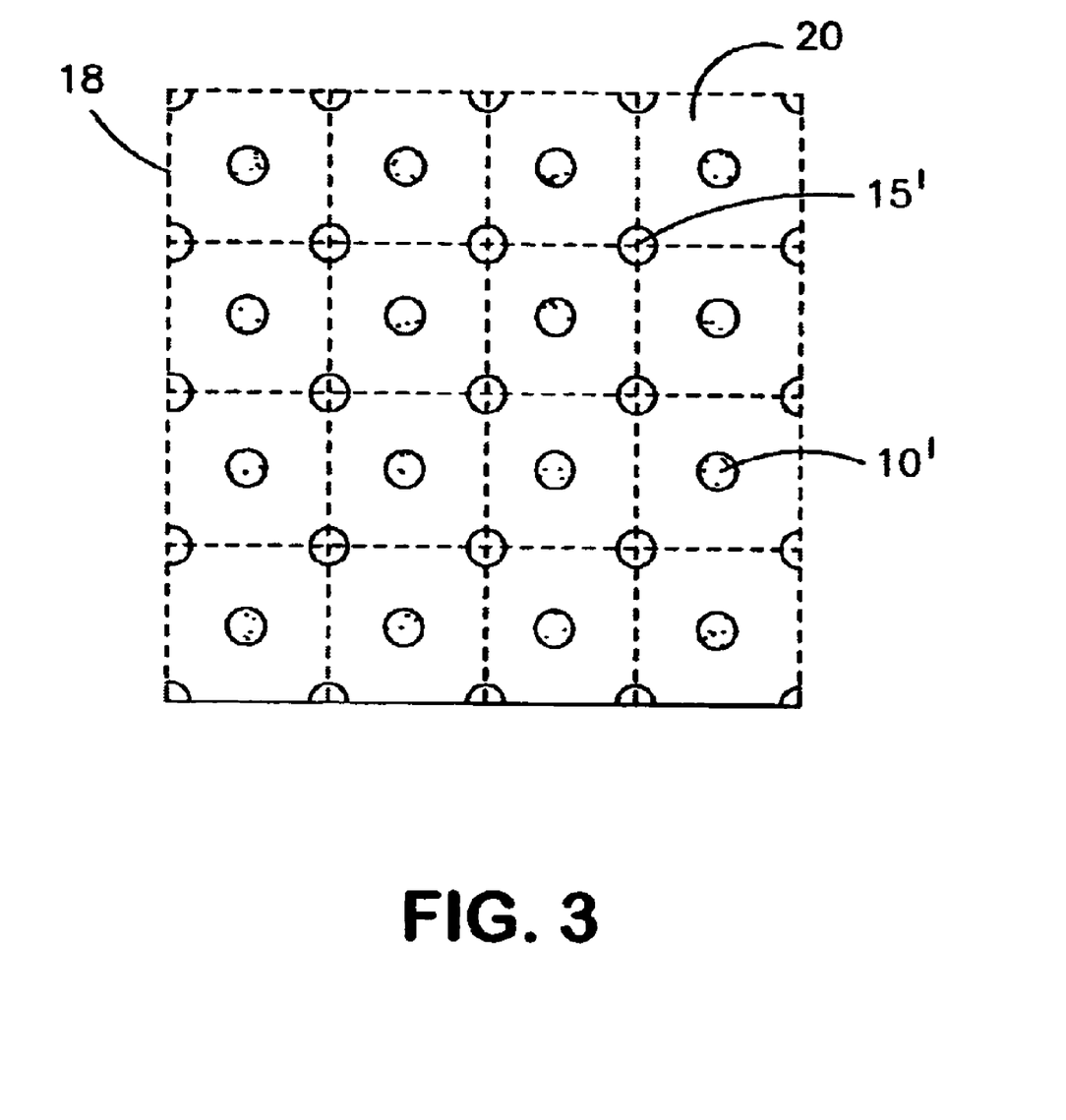
FIG. 3 is a partial top plan view of a liquid impingement manifold of the invention having the fluid microjet array and via drain distributed network arranged in a square cooling cell configuration.
Figure 4:
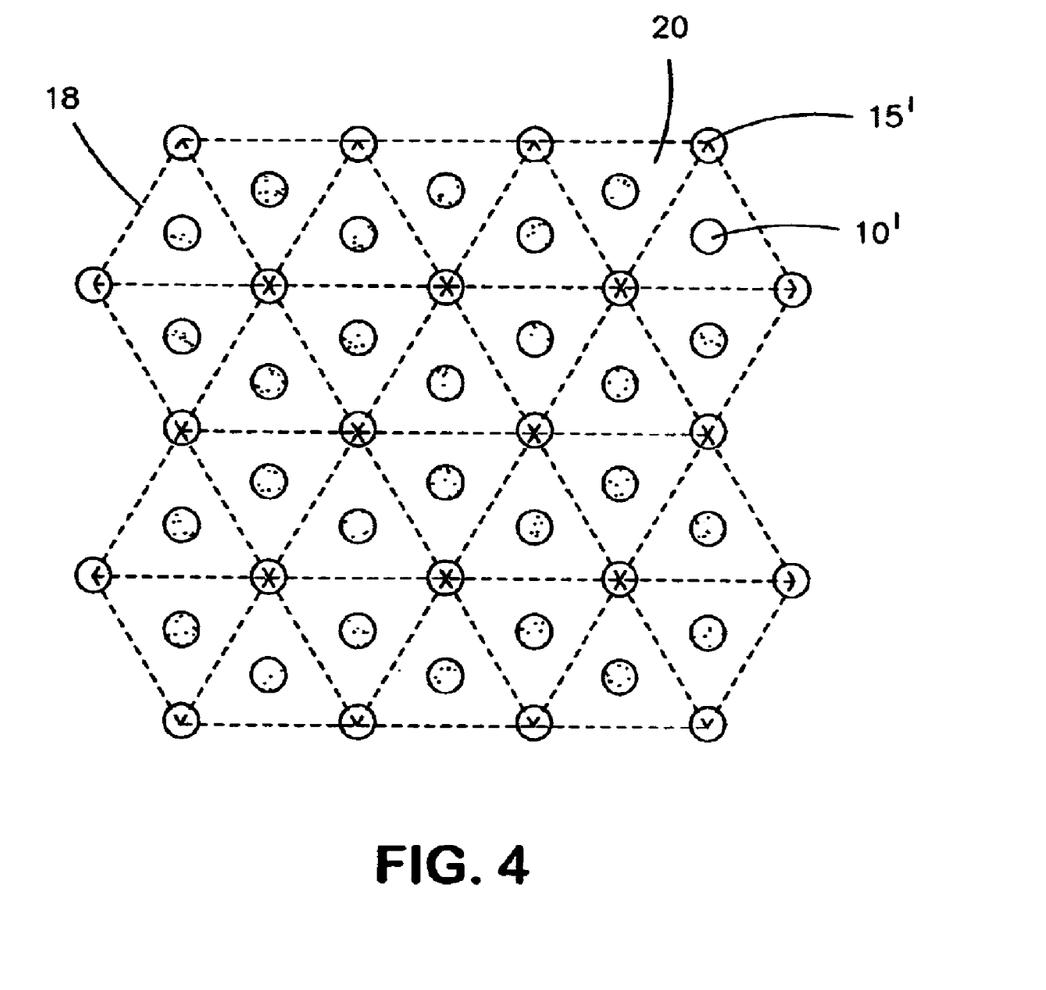
FIG. 4 is a partial top plan view of another liquid impingement manifold of the invention having the fluid microjet array and via drain distributed network arranged in a triangular cooling cell configuration.

Referring to FIGS. 3 and 4, the cooling cells 20 of the manifold are formed such that the fluid microjets of the fluid microjet array and via drains of the via drain network are formed into local cooling cells. It should be appreciated that the array of cooling cells shown in FIGS. 3 and 4 represent only a subsection of the total cell array required to cool a given surface. These local cooling cells may be uniformly shaped and have uniform sizes and microjet or drain diameter, but it is understood by those skilled in the art that the microjet and drain diameters can be different from each other to accommodate different pressure drop distribution requirements. Preferably, each fluid microjet 10' within the fluid microjet array 10 is surrounded by at least three (3) via drains 15' of the distributed via drain network 15. In so doing, each fluid microjet that provides input cooling fluid is surrounded by at least three (3) via drains that output spent fluid streams. Preferably, the fluid microjet array 10 and the distributed drain network 15 have substantially the same density distribution throughout manifold 18.

As shown in the top plan view of FIG. 3, the cooling cells 20 may be formed into an array of square cells 20 whereby each square cell includes a fluid microjet 10' substantially at a center thereof and a drain 15' at each cell vertex. That is, each square cooling cell has four (4) distinct drains, one centered on each vertex, such that each drain is split into one quarter (¼) sections each residing in four (4) distinct square cooling cells. In this aspect, the fluid microjet within an individual square cooling cell will be surrounded by the power of one entire via drain.

Alternatively, the cooling cells may be formed into an array of triangular cells 20 as shown in the top plan view of FIG. 4. In this type of arrangement, each individual triangular cell 20 has a fluid microjet 10' substantially at a center of the cell and a drain 15' at each cell vertex. As such, the individual drains 15' are divided into one sixth portions amongst the triangular cells 20 with which the drains contact. Since each individual triangular cooling cell has three (3) one sixth portions of three (3) distinct via drains, each individual triangular cooling cell has the power of one half (½) of a via drain for the fluid microjet at the center of such individual triangular cooling cell. This type of triangular arrangement results in a higher overall density of fluid microjets as compared to the square cell array. However, in accordance with the invention, a square cooling cell configuration is preferred since the square cooling cell configuration has one entire via drain for each fluid microjet within a given cell, as compared to the triangular cooling cell arrangement which has half a via drain per cooling cell, and as such, will have a higher pressure drop for a given set of operating conditions. Optionally, a larger drain via size compared to the fluid microjet via may be used to improve the pressure drop.

In yet another embodiment, the manifold 18 of the invention may be formed such that it is composed of a non-uniform pattern of a combination of local cooling cells 20 of varied shapes, sizes, and combinations thereof. The advantage of using a combination of cooling cells 20 of varying shapes and sizes is the ability to provide a manifold with cooling flux capability that changes from high heat transfer rates in areas with small cells to lower heat transfer rates in areas with relatively larger cells. This advantageously enables the formation of a manifold with cooling capabilities that match the expected cooling dissipation distribution of the target surface to be cooled, thereby minimizing the total fluid flow required to cool the heat generating component. For instance, a manifold having a non-uniform pattern of a combination of local cooling cells of varied shapes and sizes is particularly useful for cooling high power chips with local hot spots.

In any cooling cell configuration of the invention, an essential feature is that the via drains 15' are located closer to a given fluid microjet within a given cooling cell as compared to adjacent microjet-to-microjet distances. This type of cooling cell configuration defines a local cooling cell having a cooling fluid microjet located inside the defined cell area by placing all nearby via drain outlet streams at each vertex of such cell. As such, interactions between adjacent fluid microjets within adjacent cooling cells is effectively decoupled, and undesirable lateral drain flows between local cooling cells are substantially or entirely eliminated.

The decoupled interactions between adjacent fluid microjets within adjacent cooling cells of the present manifold is advantageous for effective heat transfer since the decoupled microjet array thermal performance is independent of the size of the surface area to be cooled. As such, all geometric parameters that characterize the thermal performance of a given cooling cell may be optimized to deliver a predetermined thermal performance, and then applied to heat generating components having different total cooling areas, without any degradation in cooling rate. The decoupled interactions between adjacent fluid microjets within adjacent cooling cells of the present manifold also allow for preserving the fluid flow pattern by scaling down the thermal performance and all geometric parameters characterizing a local cooling cell by the same scaling factor, whereby the heat transfer coefficient continuously increases as the fluid microjet diameter shrinks.

Figure 5:
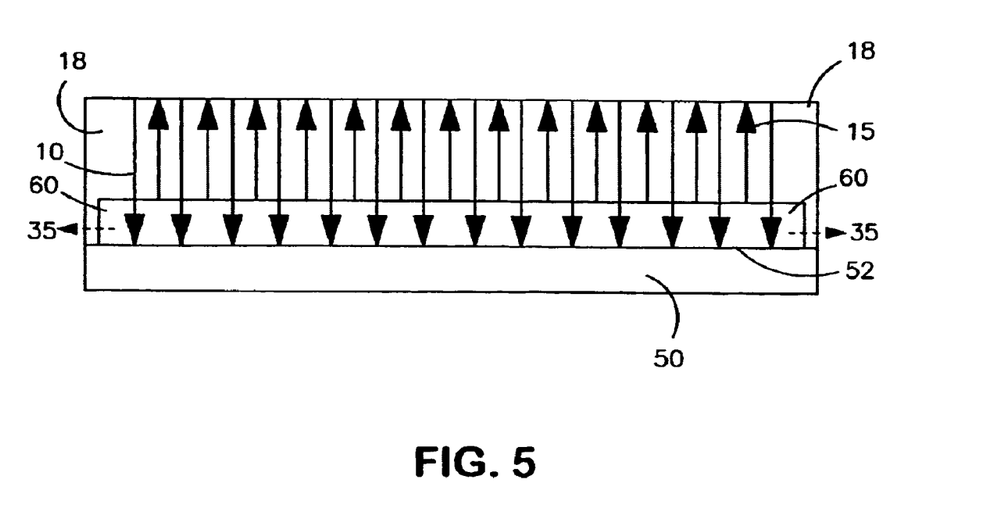
FIG. 5 is a side view of still another embodiment of the present liquid impingement manifold having a lateral drain in addition to the fluid microjet array and via drain network.

In the above embodiments of the invention, it is preferred that the manifold 18 of the invention, including fluid microjet array 10 and via drain network 15, has substantially a zero lateral drain flow at the periphery of the cooled target surface 52. However, as an alternate to the above embodiments, a lateral drain flow 35 may be added to the manifold configuration as shown in FIG. 5 in addition to the fluid microjet array 10 and via drain network 15. In so doing, a small fraction of the overall drain flow, such as about 20% of the overall drain flow, may be removed laterally from the target surface. The addition of a lateral drain flow to manifold 18 is particularly beneficial for purging surfaces of the fluid microjet array 10, via drain network 15, target surface and/or combinations thereof, for removing undesirable debris, bubbles, or other extraneous and undesirable materials, which if left to accumulate on these purged surfaces would degrade the liquid impingement and return performance of the present manifold.

Figure 6:
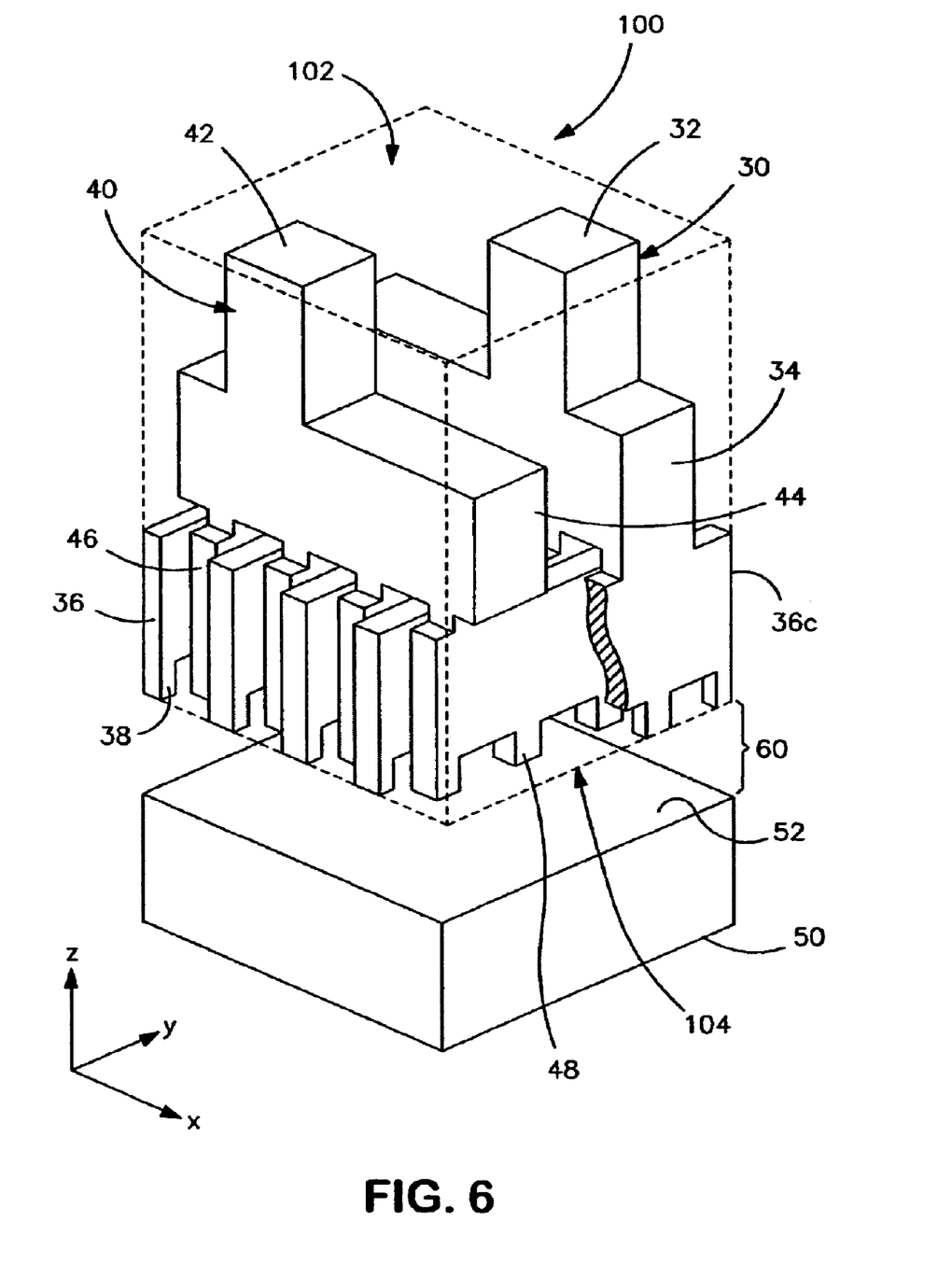
FIG. 6 is a perspective view of a liquid impingement manifold structure of the invention having at least one inlet flow manifold with a fluid microjet array and at least one drain flow manifold 30 with a via drain network for removal of spent cooling fluid.

Referring now to FIG. 6, a partial section of a liquid impingement manifold structure 100 of the invention is shown having an impinging fluid microjet array and distributed via drain streams within a cooling cell network. The liquid impingement manifold structure 100 has a top surface 102 and a bottom surface 104, whereby the plan view of surface 104 is shown in FIG. 3 having a plurality of fluid microjets of a fluid microjet array in combination with a plurality of via drain streams of a via drain network. It should be appreciated that an entire manifold structure includes multiples of the partial sections shown in FIG. 6 positioned and united together side-by-side to a minimum size approximately equal to surface 52 to be cooled. This manifold apparatus 100 resides directly over a top surface 52 of a heat generating component 50, whereby the manifold 100 and the heat generating component are separated from one another by a cavity (i.e., fluid gap 60).

The liquid impingement manifold apparatus 100 includes at least one drain flow manifold 30 and at least one inlet flow manifold 40 as is shown in FIG. 6. For ease of understanding the invention, the drain flow manifold 30 and inlet flow manifold 40 are depicted as solid bodies. However, it should be understood and appreciated that these flow manifolds 30, 40 are composed of openings, such as channels, via holes and the like, of equivalent or varied dimensions. These openings are interconnected to one another for allowing a fluid to flow through the manifold structure 100 when fluid is applied to the inlet port of such manifold structure. Further, the flow manifolds 30, 40 are intertwined with each other, and are physically separated from one another by solid walls of thickness that may vary within different regions inside the manifold structure 100.

The openings within the flow manifolds 30, 40 allow for the flow of fluid from the top surface 102 to the bottom surface 104 of manifold structure 100, and vice versa. In so doing, a fluid, preferably a cooling fluid, is provided into the inlet flow manifold 40 from the top surface 102 of the manifold through inlet port 42. This fluid is distributed throughout the flow manifold 40 via main x-axis channel 44 and then into multiple y-axis small channels 46. The fluid exits a plurality of fluid microjets 48 of a fluid microjet array such that it is dispersed throughout the fluid gap area 60 and impinges orthogonally over the top surface 52 of the heat generating component 50 for the required cooling thereof.

Spent cooling fluid is then removed from the fluid gap area 60 by uptake into the drain flow manifold 30. In particular, a plurality of via drain streams or intake holes 38 of a via drain network uptake the spent liquid into the drain flow manifold 30. The spent fluid is then distributed throughout multiple y-axis small channels 36, into the main x-axis reservoir channel 34, and then out an outlet port 32 at a top surface of the flow manifold 30 such that the spent fluid is removed from both the flow manifold 30 and the manifold apparatus 100 itself.

For purposes of maximizing the thermal performance of a liquid impingement manifold apparatus built in accordance with the invention, two dimensionless geometric parameters must be predetermined to a pre-selected design. The first parameter is a dimensionless minimum inlet microjet pitch, which is defined as the ratio between the lowest pitch of two adjacent inlet microjets 48 and the microjet 48 hydraulic diameters. In accordance with the invention, the optimal range for this parameter is between about 3 to 4 dimensionless units. It should be appreciated that parameters above 4 dimensionless units degrades the thermal performance of the manifold since the boundary layer thickness increases in a direction away from each fluid microjet centerline. Parameters below 3 dimensionless units will also degrade the thermal performance of the manifold since any fluid microjet to fluid microjet interaction alters the formation of a thin boundary layer at the cooled wall.

The second parameter is a dimensionless gap height, which is defined as the ratio between the fluid gap area 60 height and the fluid microjet 48 hydraulic diameters. The optimal range for the second parameter is between about 2 to about 3 dimensionless units. In this parameter, dimensionless units above 3 units degrades thermal performance since the fluid microjet 48 will have sufficient time to mix with the circulating spent fluid surrounding such fluid microjet 48. Also degrading thermal performance are dimensionless units below 2 units since there is insufficient circulation of spent fluid, which has adverse impact on the formation of a thin boundary layer at the cooled wall, and also contributes to increase in pressure drop within the gap 60 volume. While these two dimensionless geometric parameter ranges are preferred, it should be appreciated and understood that dimensionless units outside of these ranges will provide sufficient cooling capabilities of the present liquid impingement manifold apparatus 100, however, such thermal performance will be lower in comparison to a manifold structure designed within the above optimal dimensionless geometric parameter ranges.

The liquid impingement manifold structure 100 may be formed by MLC (multilayer ceramic) processing using a glass-ceramic material, silicon, Invar™, AlN, SiC, Cu, Ni and the like, polymers and plastics or even combinations thereof. Preferably, the manifold structure 100 for use in electronic modules is formed using a glass-ceramic material that has a low intrinsic thermal conductivity, preferably about 2 W/mK, and a TCE that closely matches the TCE of silicon, or about 3.0 E-6 $K^{-1}$. A low thermal conductivity is desirable since it minimizes the thermal exchange rate between the cold inlet fluid and the hot spent fluid in areas inside the manifold structure 100 where these two fluid streams are in close proximity. Further, a material that matches the TCE of the target surface 52 is preferred since it facilitates direct sealing between the manifold structure 100 and the target surface, particularly when the manifold structure 100 is a fully encapsulated module, i.e., the manifold structure fully encapsulates the fluid gap area 60.

Figure 7:
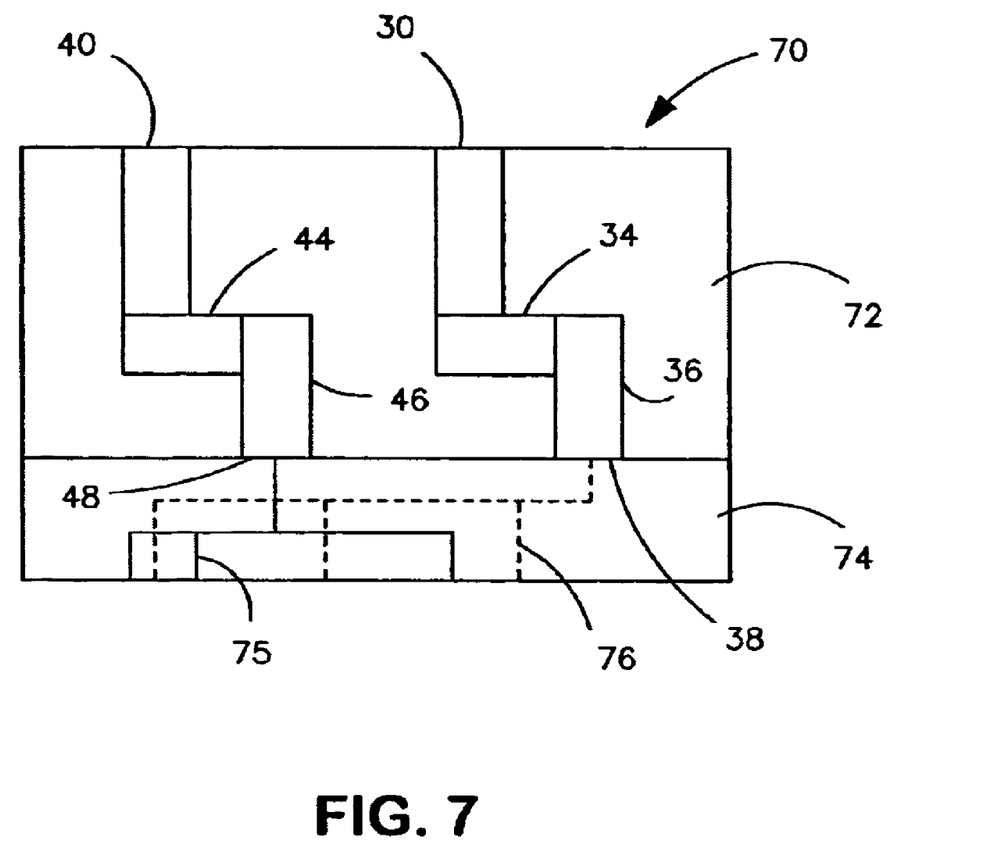
FIG. 7 is a side view of an alternate liquid impingement manifold structure having a top and bottom section whereby the bottom section has microjets and via drain holes with pattern dimensions smaller than fluid microjets and via drain holes residing within the top section to provide a higher thermal performance.

Referring to FIG. 7, an alternate liquid impingement manifold structure 70 may be formed in two distinct sections, particularly a top section 72 and a bottom section 74. The top section 72 is preferably formed in accordance with the above description of the invention, and as depicted in FIGS. 3 and 6. As such, the top section 72 includes an inlet flow manifold 40 having the x-axis channel 44, multiple y-axis small channels 46 and the fluid microjets 48, as well as the drain flow manifold 30 having the x-axis channel 34, multiple y-axis small channels 36 and the via drain holes 38. However, depending upon the end use of the manifold 70, the fluid microjets 48 and via drain holes 38 may need to have smaller pattern dimensions, larger pattern dimensions, or combinations thereof, such as, having smaller diameters, larger diameters, or combinations thereof. As such, the bottom section 74 is fabricated using photolithography processes to enable the formation of fluid microjets 75 and via drain holes 76 with pattern dimensions different than those of the fluid microjets and via drain holes residing within the top section 72. By selecting TCE compatible materials, the top section 72 and bottom section 74 may be attached to one another to form a manifold structure 70 that has an even higher performance as compared to top portion 72, which by itself is a manifold structure of the invention, for example performances above 1000 W/cm$^2$.

Figure 8:
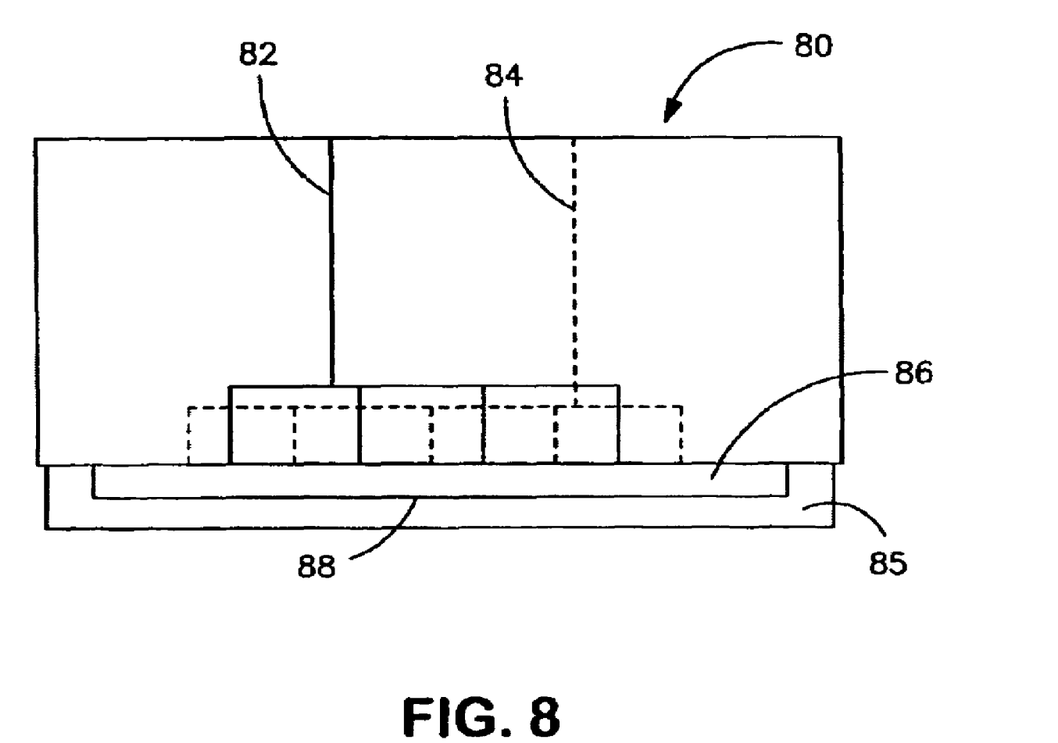
FIG. 8 is a side view of still another liquid impingement manifold structure having an inlet microjet manifold and a drain manifold encapsulated using a thin plate to form a fluid cavity within the manifold.

Further, FIG. 8 shows yet another liquid impingement manifold structure 80 of the invention. In this manifold structure 80, an inlet microjet manifold 82 and a drain manifold 84 are encapsulated using a thin silicon plate 85 such that a fluid cavity 86 is formed. The fluid cavity 86 provides the volume required to get the microjet impingement action for cooling. The manifold structure 80 and the silicon plate 85 are attached to one another to provide a self-contained manifold device that can be pre-tested independently from the heat generating component to ensure adequate thermal performance. Once it is determined that the manifold 80 has adequate thermal performance, the components may be detached from one another, and then the manifold joined to a heat generating component through the use of thermally conductive adhesives, solders, and the like, or even combinations thereof. Preferably, the surface 88 of plate 85 within the fluid cavity 86 is machined to form microfins thereon in a pattern that does not interfere with the orthogonally impinging microjets. In so doing, the effective convective heat transfer coefficient over surface 88 can be doubled with a modest increase of pressure drop, such as a pressure drop of less than about 1 psig. The manifold assembly can be mounted directly on to the heat generating surface such as a semiconductor chip.

EXAMPLE

A 25 mm×25 mm×6 mm liquid impingement manifold structure of the invention was formed using MLC processes and glass ceramic material. MLC processing is preferred since it can produce the present manifold structures with fluid microjet diameters in the range of about 0.05 to 0.50 mm, and microjet-to-microjet pitch as low as about 0.225 mm. The manifold bottom surface 104 has the fluid microjet array-via drain network arrangement shown in FIG. 3, and includes approximately 1600 inlet fluid microjet holes and approximately 1681 via drain holes, with sintered diameters of about 126 microns. The sintered microjet to microjet pitch is about 438 microns.

To test the above manifold structure, a powered silicon chip with multiple thermal sensors was placed 165 μm away from the glass ceramic manifold structure. Collected thermal performance data shows that this manifold structure provides a convective heat transfer coefficient of 5.2E04 W/m$^2$K using water as the cooling fluid with a microjet velocity of 2 m/s and overall pressure drop below 10 psig. Using the above manifold structure on a 700 micron thick silicon chip, using water to cool, which is at an inlet temperature of 22° C., and a maximum temperature at the chip transistor plane of about 85° C., the structure provides an average cooling capability of 256 W/cm$^2$. It should be appreciated that by reducing the microjet diameter and pitch, a much higher rate of heat removal per unit area may be achieved in accordance with the invention. A detailed three-dimensional modeling of the foregoing example using commercially available CFD (computer fluid dynamics) code showed less than 12% deviation between the experimental data collected and the computer simulations.

Other improved thermal performances of the present liquid impingement manifolds are shown in the below chart of thermal performance results for four (4) different two dimensional-axisymmetric models under various processing Parameters.

| Fluid | Case 1 water | Case 2 water | Case 3 water | Case 4 GaIn Eutectic |
|---|---|---|---|---|
| Heat flux (W/cm$^2$) | 200 | 500 | 1000 | 1000 |
| Setup Parameters: | | | | |
| microjet diameter (μm) | 100 | 100 | 100 | 100 |
| grid size (μm) | 500 | 500 | 350 | 350 |
| microjet-to-wall distance (μm) | 400 | 400 | 200 | 200 |
| chip thickness (μm) | 700 | 700 | 700 | 250 |
| microjet velocity (m/s) | 2.5 | 7.0 | 25 | 3 |
| inlet water temp. (° C.) | 22 | 22 | 22 | 22 |
| Results: | | | | |
| jet Reynolds Number | 250 | 700 | 2500 | 915 |
| max. chip temp. (° C.) | 59.7 | 78.8 | 97.5 | 67.5 |
| jet dP (1 psig) | 1.7 | 7.3 | 48 | 6.4 |
| h-avg. (W/cm$^2$/K) | 5.9 | 7.0 | 35.2 | 31.8 |
| Nusselt number avg. | 9.8 | 11.7 | 59 | 0.96 |
| thermal resistance (C/W/cm$^2$) | 0.19 | 0.11 | 0.08 | 0.05 |

The above examples were substantially performed using water as the cooling fluid, however, it should be appreciated and understood that a variety of other known cooling materials may be used in the manifold structures of the present invention. Fluids are preferred for high heat transfer rates since fluids have a substantially high heat transfer coefficient than gases. However, liquid metals and gases may also be employed within the present manifold for cooling surfaces of heat generating components. For instance, liquid metals may include those metals that are liquid at room temperature and can deliver very high cooling rate capability, well above 1000 W/cm$^2$ such as, for example, GaIn and Hg. Gases may also be employed in the present fluid delivery and retrieval manifold of the invention such as, but not limited to, air, $N_2$, $CO_2$, $H_2$, He, or other non-reacting gases, and even combinations thereof.

Figure 9A:
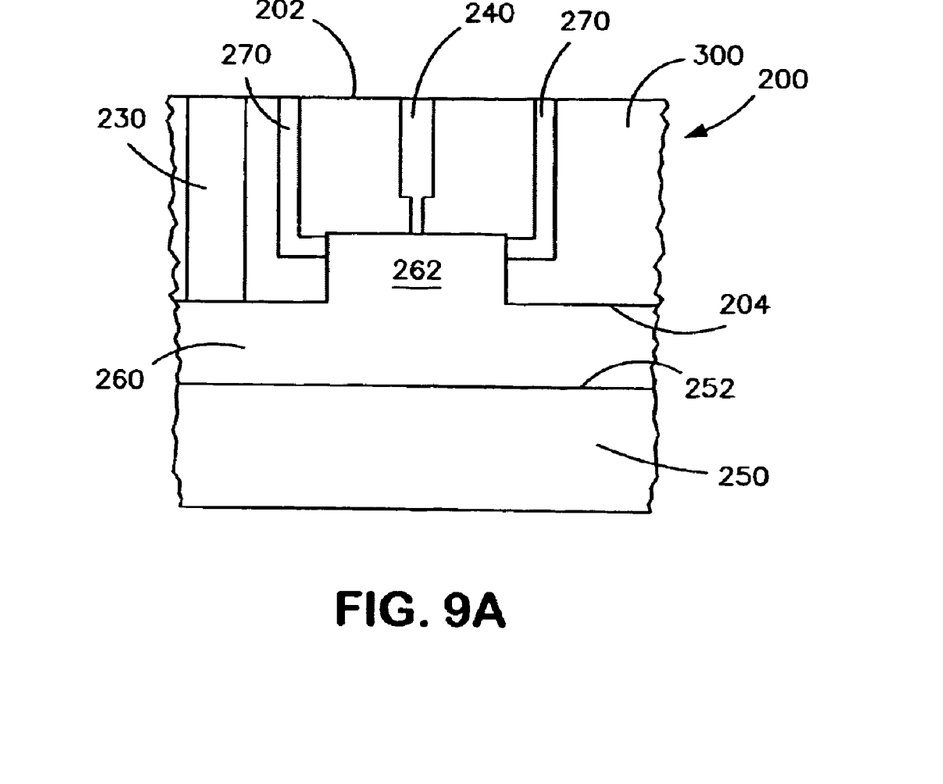
FIG. 9A is a side view of an alternate two-phase liquid microspray impingement manifold structure of the invention showing details of one cooling cell and associated air cavity.
Figure 9B:
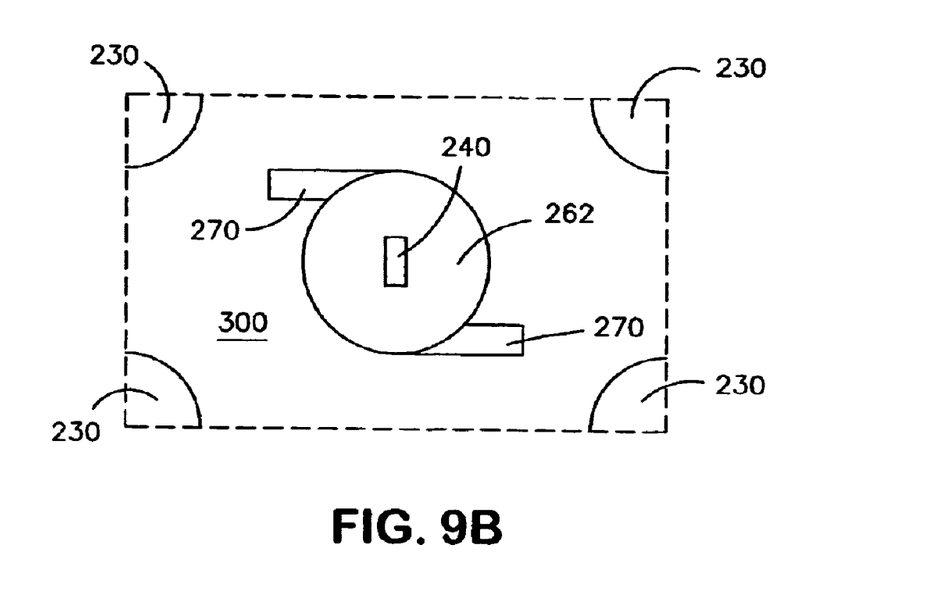
FIG. 9B is a top plan view showing partial details of a cooling cell air cavity of a two-phase liquid microspray impingement manifold structure of the invention.
Figure 10:
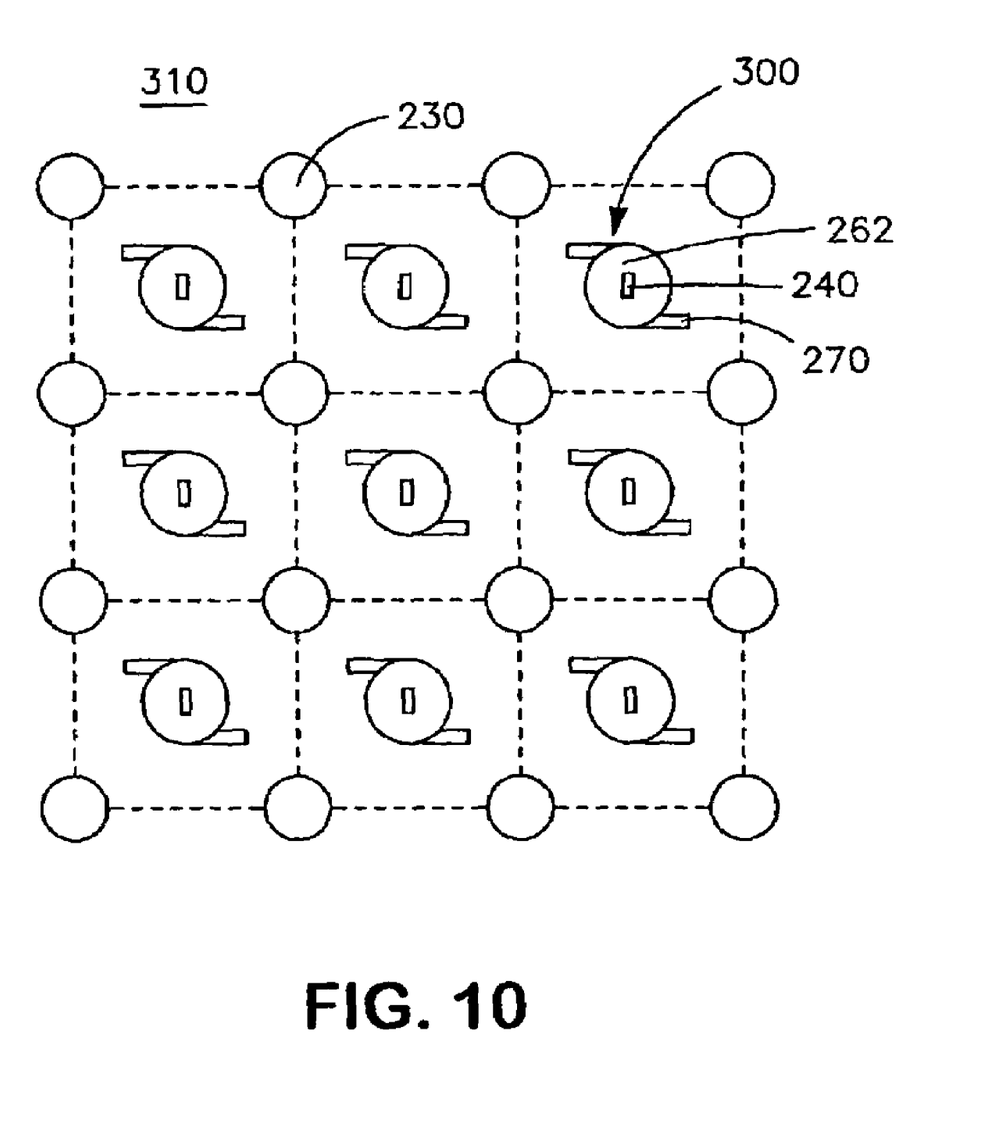
FIG. 10 is a partial top plan view of a liquid microspray impingement manifold of the invention having the arrays arranged in a square cooling cell configuration.

While not deviating from the novel concepts of the invention, an alternate embodiment of the invention is shown in FIGS. 9A-10. In this embodiment, a surface 252 of a heat generating component 250, such as a semiconductor chip, is cooled using a liquid microspray cooling manifold 200 of the invention. Referring to the side view of FIG. 9A and the top plan view of FIG. 98, the microspray cooling manifold 200 is composed of at least one cooling cell 300 having at least one liquid microjet spray nozzle 240, at least one gas flow microjet nozzle 270 (preferably two), at least one drain line 230 and at least one cavity 262.

The liquid microjet spray nozzle 240 and the microjet nozzles 270 traverse through the manifold 200 such that they extend from a top surface 202 thereof down to and reside within cavity 262. This liquid microjet spray nozzle 240 allows cooling fluid to be provided from a top surface of the manifold toward the target surface 252 such that the cooling fluid has an inflow velocity orthogonally toward the target surface 252. The cooling fluid exits the microjet spray nozzle 240 within the cavity 262, which resides at a bottom surface 204 of the manifold as shown in FIG. 9A. The at least one drain line 230 also traverses a thickness of the manifold in a direction orthogonal to the target surface 252 and parallel to the fluid microjet array 240.

A gas flow is injected into cavity 262 via the gas flow microjet nozzles 270, whereby the gas flow surrounds the cooling fluid exiting the microjet spray nozzle 240. The gas flow impinges on the liquid flow to disperse such liquid flow and generate a liquid-gas dispersion of an atomized liquid spray. This gas flow is also used to modulate the liquid spray angle and force the atomized liquid spray toward the target surface 252. The gas and liquid flows are injected into cavity 262 at velocities and pressures sufficient to enable mixing of the gas with the liquid and atomization of the liquid, whereby a higher gas velocity will result in a narrower liquid spray angle. The ejected gas forces the atomized liquid spray out of cavity 262 into gap area 260 in a direction toward the heat generating target surface 252. Once within gap area 260, the atomized liquid spray vaporizes upon contact with the heat generating target surface 252. The spent cooling vapors are then removed from gap area 260 via the at least one drain 230. In so doing, these spent cooling vapors are removed from over the target surface 252 at an outflow velocity orthogonally away from the target surface.

As discussed in detail above, the local cooling cells may be uniformly shaped and have uniform sizes and microjet or drain diameters, or the microjet and drain diameters can be different from each other to accommodate different pressure drop distribution requirements. For instance, referring to FIG. 9B, each cooling cell 300 of manifold 310 may include one quarter of four distinct drain lines 230 at vertices thereof, such that, the equivalent of one full drain surrounds each microjet 240. It is an essential feature of the invention that in the cooling cell configurations the drains be located closer to a given microjet within a given cooling cell, as compared to microjet-to-microjet distances within the structure. As the drain outlet streams are located at each vertex of the cooling cells, cooling capabilities of each cooling cell are maximized since interactions between adjacent fluid microjets within adjacent cooling cells is effectively decoupled, and undesirable lateral drain flows between local cooling cells are substantially or entirely eliminated.

In accordance with the invention, the manifold of FIGS. 9A-10 may also include a lateral drain flow (as depicted by reference numeral 35 in FIG. 5), may be constructed in two distinct sections for providing smaller microjets (as shown and discussed in relation to FIG. 7), may be attached to a silicon plate for pre-testing (as shown and discussed in relation to FIG. 8), or even combinations thereof. The gases and liquids suitable for use with this embodiment of the invention include those gases and liquids conventionally known and used for cooling/heating substrate surfaces.

It should be understood that the target surface may be heated and/or cooled in a continuous, identical manner across the entire target surface area, or alternatively, it may be heated and/or cooled non-uniformly across the target surface area. Wherein the target surface area is heated and/or cooled non-uniformly, the manifold(s) of the invention may be designed and configured to cool, heat, or simultaneously cool and heat different areas of the target surface at different rates and under different processing conditions based on the varying topography including, but not limited to, hierarchy, materials, dimensions, parameters, and the like, residing across the target surface area. In this aspect, the manifold of the invention may have a plurality of different cooling cells throughout the manifold, whereby these varying cooling cells are designed and configured to heat and/or cool the varying topography that resides across the target surface area. For example, such a manifold of the invention would be ideal for cooling and/or heating of multichip modules.

Thus, having described the invention, what is claimed is:

What is claimed is:

1. A liquid impingement manifold apparatus for thermal control of a substrate comprising:
   a manifold body for attachment to a substrate surface;
   a liquid microjet traversing through said manifold body opening into a first cavity of said manifold body;
   a gas microjet traversing through said manifold body adjacent said liquid microjet and opening into said first cavity;
   a second cavity of said manifold body in communication with said first cavity, said second cavity being larger than said first cavity; and
   a drain traversing through said manifold body parallel to said liquid microjet, said drain having an open end within said second cavity,
   whereby said liquid microjet emits a liquid and said gas microjet emits a gas into said first cavity to form an atomized liquid spray therein that are forced into said second cavity for contact with said substrate surface while said drain removes spent atomized liquid from said second cavity in a direction orthogonal to said substrate surface.

2. The apparatus of claim 1 further comprising:
   a plurality of said gas microjets;
   a plurality of said liquid microjets, whereby each liquid microjet is surrounded by at least one gas microjet of said plurality of gas microjets;
   a plurality of said first cavities opening Into said second cavity, each of said first cavities having at least one said liquid microjet surrounded by said at least one gas microjet; and
   a plurality of said drains having open ends within said second cavity, whereby at least three drains surround each said liquid microjet.

3. The apparatus of claim 2 further including a plurality of cooling cells with at least three vertices, each cooling cell having said liquid microjet surrounded by said at least one gas microjet and said at least three drains centered at each vertex of said cooling cell.

4. The apparatus of claim 1 wherein said liquid microjet and said gas microjet reside within an inlet manifold of said apparatus, while said drain resides within a drain manifold of said apparatus, said inlet and drain manifolds being intertwined with each other.

5. The apparatus of claim 1 further including at least one lateral drain within said manifold body.

6. A method for thermally controlling a substrate temperature comprising:
   providing a manifold body of a first manifold attached to a second manifold, said first manifold having a first microjet array and a first drain array both traversing through said first manifold body in a direction parallel to each other and orthogonal to a surface of a substrate, said second manifold having a second microjet array and a second drain array traversing there-through with smaller diameters in comparison to said first microjet array and said first drain array, said second microjet array and said second drain array being respectively in alignment with said first microjet array and said first drain array of said manifold body;

attaching said manifold body to said substrate surface whereupon a cavity is formed between said manifold body and said substrate surface;

emitting a liquid from said first and second microjet arrays into said cavity;

contacting said liquid to said substrate surface for controlling a temperature thereof; and removing spent said liquid from said cavity in a direction orthogonal to said substrate surface via said first and second drain arrays, whereby each said microjet is surrounded by at least three drains to prevent interaction between adjacent microjets.

7. The method of claim 6 wherein said manifold body further includes a plurality of cooling cells, each cooling cell having at least three vertices and a microjet of said microjet array that is surrounded by said at least three drains which are centered on said vertices for substantially eliminating lateral drain flows between adjacent cooling cells.

8. The method of claim 6 wherein said plurality of cooling cells comprise a plurality of varying cooling cells residing throughout said manifold for controlling a variety of different temperatures across said substrate surface.

9. The method of claim 7 wherein said plurality of cooling cells have geometrical shapes selected from the group consisting of triangular cooling cells, square cooling cells, uniformly shaped cooling cells, non-uniformly shaped cooling cells and combinations thereof.

10. The method of claim 6 wherein said liquid comprises a cooling liquid for controlling said temperature by cooling said substrate.

11. The method of claim 6 wherein said liquid comprises a heating liquid for controlling said temperature by heating said substrate.

12. The method of claim 6 wherein said manifold body is capable of controlling said temperature at a rate above about 100 W/cm$^2$ while maintaining a total internal liquid pressure drop below about 10 psig.

13. The method of claim 6 further including at least one lateral drain within said manifold body for removing undesirable matter from said cavity.

14. A liquid impingement manifold apparatus for thermal control of a substrate comprising:
a manifold body for attachment to a substrate surface;
a microjet array traversing through said manifold body in a direction orthogonal to said substrate surface;
a drain array traversing through said manifold body adjacent to and parallel to said microjet array;
a cavity of said manifold body over said substrate surface;
a second manifold body attached to said manifold body, said second manifold body having a second microjet array and a second drain array respectively in alignment with said microjet array and said drain array of said manifold body, said second microjet array and said second drain array having different dimensions in comparison to said microjet array and said drain array of said manifold body whereby said microjet arrays emit a liquid into said cavity for contact with said substrate surface for thermal control thereof while said drain arrays remove spent liquid from said cavity in said direction orthogonal to said substrate surface.

15. The apparatus of claim 14 wherein said manifold body and said second manifold body comprise materials having compatible thermal coefficients of expansion.

16. A method for thermally controlling a substrate temperature comprising:
providing a manifold body having a microjet array and a drain array both traversing through said manifold body in a direction parallel to each other and orthogonal to a surface of a substrate;

attaching said manifold body to said substrate surface whereupon a cavity is formed between said manifold body and said substrate surface, said cavity comprises a plurality of first cavities all opening into a second cavity;

providing a gas microjet array within said manifold body, said microjet array and said gas microjet array having ends opening into said plurality of first cavities whereby each first cavity has a microjet adjacent at least one gas microjet;

emitting a liquid from said microjet array and a gas from said gas microjet array within said plurality of first cavities;

mixing said liquid and said gas within said plurality of first cavities to form an atomized liquid spray; transferring said atomized liquid spray from said plurality of first cavities into said second cavity;

contacting said substrate surface with said atomized liquid spray within said second cavity for controlling a temperature thereof; and removing spent vaporized liquid molecules from said second cavity in a direction orthogonal to said substrate surface via said drain array, whereby each said microjet is surrounded by at least three drains to prevent interaction between adjacent microjets.

17. The method of claim 16 further including a plurality of cooling cells with at least three vertices, each cooling cell including said microjet adjacent said at least one gas microjet opening into said first cavity and at least three drains, one centered at each of said at least three vertices, for preventing interaction between adjacent microjets.

* * * * *